United States Patent
Jang (10) Patent No.: US 6,503,818 B1
(45) Date of Patent: Jan. 7, 2003

(54) DELAMINATION RESISTANT MULTI-LAYER COMPOSITE DIELECTRIC LAYER EMPLOYING LOW DIELECTRIC CONSTANT DIELECTRIC MATERIAL

(75) Inventor: Syun-Ming Jang, Hsin-Chu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/285,915

(22) Filed: Apr. 2, 1999

(51) Int. Cl.$^7$ .............................. B05D 3/06; C23C 16/56; C23C 16/50
(52) U.S. Cl. ..................... 438/584; 427/535; 427/536; 427/539; 438/702; 438/763; 438/780; 438/787; 438/782; 438/790; 438/788
(58) Field of Search ................... 427/534, 535, 427/536, 539, 579; 438/761, 763, 780, 781, 782, 787, 788, 789, 790, 702, 584, 688, 687

(56) References Cited

U.S. PATENT DOCUMENTS

| | | | | |
|---|---|---|---|---|
| 5,196,251 A | * | 3/1993 | Bakhru et al. | |
| 5,334,552 A | * | 8/1994 | Homma | |
| 5,399,529 A | * | 3/1995 | Homma | |
| 5,403,780 A | | 4/1995 | Jain et al. | 437/195 |
| 5,405,805 A | * | 4/1995 | Homma | |
| 5,420,075 A | * | 5/1995 | Homma et al. | |
| 5,429,995 A | * | 7/1995 | Nishiyama et al. | 427/579 |
| 5,536,681 A | | 7/1996 | Jang et al. | 437/195 |
| 5,554,567 A | | 9/1996 | Wang | 437/195 |
| 5,571,576 A | * | 11/1996 | Qian et al. | 427/574 |
| 5,635,425 A | | 6/1997 | Chen | 438/631 |
| 5,728,630 A | * | 3/1998 | Nishimura et al. | 438/763 |
| 5,970,376 A | * | 10/1999 | Chen | 438/637 |
| 6,007,733 A | * | 12/1999 | Jang | 216/80 |
| 6,019,906 A | * | 2/2000 | Jang | 216/2 |
| 6,022,802 A | * | 2/2000 | Jang | 438/656 |
| 6,137,176 A | * | 10/2000 | Morozumi et al. | 257/751 |
| 6,165,897 A | * | 12/2000 | Jang | 438/778 |
| 6,242,366 B1 | * | 6/2001 | Beekman et al. | 438/790 |
| 6,214,749 B1 | * | 4/2002 | Watanabe et al. | 438/783 |
| 6,403,464 B1 | * | 6/2002 | Chang | 438/787 |
| 6,436,808 B1 | * | 8/2002 | Ngo et al. | 438/780 |
| 6,436,824 B1 | * | 8/2002 | Chooi et al. | 438/780 |
| 2002/0074309 A1 | * | 6/2002 | Bjorkman et al. | 438/780 |

OTHER PUBLICATIONS

*Webster's Ninth New Collegiate Dictionary*, Merriam–Webster Inc., Springfield, MA, U.S.A.–excerpt p. 750, 1983 (no month).*

* cited by examiner

*Primary Examiner*—Marianne Padgett
(74) *Attorney, Agent, or Firm*—George O. Saile; Stephen B. Ackerman; Stephen G. Stanton (57) ABSTRACT

A method for forming a composite dielectric layer comprising a low dielectric constant dielectric layer upon a substrate employed within a microelectronics fabrication. There is provided a patterned microelectronics layer upon a substrate employed within a microelectronics fabrication. There is then formed upon the microelectronics substrate a low dielectric constant dielectric layer. There is then treated the low dielectric constant dielectric layer with a plasma, forming a plasma treated low dielectric constant dielectric layer. There is then formed upon the plasma treated low dielectric constant dielectric layer a silicon containing dielectric layer with enhanced adhesion thereupon.

5 Claims, 5 Drawing Sheets

FIG. 13

DELAMINATION RESISTANT MULTI-LAYER COMPOSITE DIELECTRIC LAYER EMPLOYING LOW DIELECTRIC CONSTANT DIELECTRIC MATERIAL

BACKGROUND OF THE INVENTION

1. Field of the Invention

The invention relates generally to the field of low dielectric constant dielectric layers. More particularly, the invention relates to the utilization of low dielectric constant dielectric layers within composite dielectric layers employed in microelectronics fabrications.

2. Description of the Related Art

Microelectronics fabrications are formed from microelectronics substrates over which are formed patterned microelectronics conductor layers which are separated by, microelectronics dielectric layers.

As microelectronics integration levels have increased and patterned microelectronics conductor layer linewidth dimensions have decreased, it has become more common within the art of microelectronics fabrication to employ low dielectric constant dielectric layers formed interposed between the patterns of patterned microelectronics conductor layers within microelectronics fabrications. Low dielectric constant dielectric layers are desirable interposed between the patterns of patterned microelectronics conductor layers within microelectronics fabrications since such low dielectric constant dielectric layers typically provide microelectronics fabrications with enhanced microelectronics fabrication speed, reduced microelectronics fabrication parasitic capacitance and attenuated patterned microelectronics conductor layer cross-talk Of the methods and materials which may be employed for forming low dielectric constant dielectric layers interposed between the patterns of patterned microelectronics conductor layers within microelectronics fabrications, methods which employ low dielectric constant dielectric materials such as but not limited to organic polymer spin-on-polymer (SOP) dielectric materials (including but not limited to polyimide organic polymer spin-on-polymer (SOP) dielectric materials, poly (arylene ether) organic polymer spin-on-polymer (SOP) dielectric materials and fluorinated poly (arylene ether) organic polymer spin-on-polymer (SOP) dielectric materials), amorphous carbon dielectric materials (including fluorinated amorphous carbon dielectric materials) and silsesquioxane spin-on-glass (SOG) dielectric materials (including but not limited to hydrogen silsesquioxane (HSQ), carbon bonded methylsilsesquioxane (MSQ) and carbon bonded fluorocarbon silsesquioxane (FSQ) dielectric materials) are particularly desirable within the art of microelectronics fabrication. Such methods and materials are desirable due in particular to the ease of fabrication of dielectric layers by spin-on methods or by chemical vapor deposition (CVD) methods and the resulting low dielectric constant of the low dielectric constant dielectric layers, which typically exhibit homogeneous dielectric constant values ranging from about 2.5 to about 3.3. For comparison purposes, conventional silicon containing dielectric layers formed of silicon containing dielectric materials such as but not limited to silicon oxide dielectric materials and silicon nitride dielectric materials employed within microelectronics fabrications typically exhibit homogeneous dielectric constants within a range of from about 4.0 to about 4.4.

Within microelectronics fabrications, low dielectric constant dielectric layers typically have formed thereupon a cap layer of silicon containing dielectric material such as, for example, silicon nitride. One purpose of the cap layer is to furnish a hard mask layer for pattern transfer of a photo-lithographically defined pattern in the cap layer to the underlying low dielectric constant dielectric layer by methods as are known in the art of microelectronics fabrication, such as oxygen plasma etching in the case of organic polymer low dielectric constant dielectric layers. Another purpose of the cap layer is to serve as a moisture barrier layer when the underlying low dielectric constant dielectric layer is formed from a spin-on-glass (SOG) low dielectric constant material or other moisture sensitive material.

While low dielectric constant dielectric layers have found increasing applications within microelectronics fabrications, their employment in microelectronics fabrications is not without problems. In particular, there is often observed delamination of the silicon-containing dielectric cap layer from the low dielectric constant dielectric layer. In addition, there is frequently a need for a barrier layer impervious to moisture to protect the low dielectric constant dielectric layer from degradation.

It is therefore towards the goal of forming within microelectronics fabrications low dielectric constant dielectric layers with enhanced adhesion to overlying silicon containing dielectric layers such as silicon nitride cap dielectric layers that the present invention is more generally directed.

Various methods have been disclosed within the art of microelectronics fabrications for forming composite dielectric layers with desirable properties within microelectronics fabrications. The provision of adequate adhesion between the component layers of a composite dielectric layer structure is a primary object of the art, as is the capability of filling gaps and other non-planar features of the underlying substrates employed in microelectronics fabrications. These objects are achieved by methods which are conventional in the art such as spin-on methods, chemical vapor deposition (CVD) methods and plasma assisted chemical vapor deposition (PECVD) methods.

For example, Chen, in U.S. Pat. No. 5,635,425, discloses a method for improving adhesion of a patterned overlying dielectric layer formed by chemical vapor deposition (CVD) from TEOS vapor to an underlying dielectric layer and/or conductor layer within a microelectronics fabrication. The method employs simultaneous or sequential exposure of the underlying dielectric or conductor layers to a nitrogen plasma incidental to forming the overlying dielectric layer.

Further, Wang, in U.S. Pat. No. 5,554,567, discloses a method for improving adhesion of an overlying dielectric layer to the surface of an underlying dielectric layer where the underlying dielectric layer is formed of a spin-on-glass (SOG) dielectric material. The method employs a vacuum heat treatment of the spin-on-glass (SOG) dielectric material prior to formation of the overlying layer, which is deposited upon the underlying dielectric layer without breaking vacuum.

Still further, Jang et al., in U.S. Pat. No. 5,536,681, disclose a method for improving gap filling characteristics of silicon oxide layers deposited over patterned substrate layers employing an ozone assisted chemical vapor deposition (CVD) method employing tetra-ethyl-ortho-silicate (TEOS) as a silicon source material. The method employs a selective nitrogen plasma treatment of upper lying portions of a silicon oxide liner layer formed upon the patterned substrate layer to provide a retarded growth rate of the gap filling silicon oxide dielectric layer upon the upper lying portions of the silicon oxide liner layer in comparison with the lower lying portion of the silicon oxide liner layer.

Finally, Jain et al., in U.S. Pat. No. 5,403,780, disclose a method for forming a silicon oxide dielectric layer with enhanced planarization, etchback margin and reliability within a semiconductor integrated circuit microelectronics fabrication. The method employs a silicon rich silicon oxide underlayer of refractive index greater than 1.50. Thereupon is formed a second layer of silicon oxide deposited By chemical vapor deposition (CVD) employing tetra-ethyl-ortho-silicate (TEOS) as the silicon source material.

Desirable in the art of microelectronics fabrication are additional methods and materials for forming with enhanced adhesion composite dielectric layers employing low dielectric constant dielectric materials.

It is towards the foregoing goal that the present invention is generally and specifically directed.

SUMMARY OF THE INVENTION

A first object of the present invention is to provide within a microelectronics fabrication a method for morning with enhanced interfacial adhesion a composite dielectric layer while employing a low dielectric constant material A second object of the present invention is to provide in accord with the first object of the present invention a method of enhancement of adhesion of composite dielectric layers which is readily commercially implemented.

In accord with the objects of the present invention, there is provided by the present invention a method for forming a composite dielectric layer comprising a low dielectric constant dielectric layer upon a substrate employed within a microelectronics fabrication. To practice the method of the present invention, there is first provided a patterned microelectronics layer upon a substrate employed within a microelectronics fabrication. There is then formed upon the microelectronics substrate layer a low dielectric constant dielectric layer. There is then treated the low dielectric constant dielectric layer with a plasma, forming a plasma treated low dielectric constant dielectric layer. There is then formed upon the plasma treated low dielectric constant dielectric layer a silicon containing dielectric layer with enhanced adhesion thereupon.

The present invention may be employed where the microelectronics fabrication is an integrated circuit microelectronics fabrication. The method of the present invention does not discriminate with respect to the nature of the microelectronics fabrication within which there may be formed a composite dielectric layer comprising a low dielectric constant dielectric layer upon which is deposited a silicon containing dielectric layer useful in further microelectronics fabrication processing steps. Thus, although the method of the present invention provides value when forming an upper silicon containing dielectric layer upon a low dielectric constant layer formed upon a substrate layer within a microelectronics fabrication, the method of the present invention may also be employed when forming an upper silicon containing dielectric layer with enhanced adhesion upon a low dielectric constant dielectric layer employed within microelectronics fabrications including but not limited to integrated circuit microelectronics fabrications, charge coupled device microelectronics fabrications, solar cell microelectronics fabrications, ceramic substrate microelectronics fabrications and flat panel display microelectronics fabrications.

The method of the present invention provides for enhancement of the adhesion of an upper silicon containing dielectric material layer deposited upon a low dielectric constant dielectric layer by exposing the surface of the low dielectric constant dielectric layer to a plasma in reactor chamber followed by depositing said silicon containing dielectric layer in the same reactor chamber employing high density plasma chemical vapor deposition (HDP-CVD) method. The enhanced adhesion observed upon plasma exposure of the underlying dielectric layer prior to deposition of the silicon containing dielectric film is probably due to specific interactions which differ with different layer combinations with different plasma gases, but the resulting improvement is beneficial in each case.

The method of the present invention is readily commercially implemented. The low dielectric constant dielectric layer is formed employing organic polymer spin-on-polymer (SOP) methods, spin-on-glass (SOG) methods, or alternatively chemical vapor deposition (CVD) methods which are generally known within the art of microelectronics fabrication. Forming plasmas within reactor chambers which are also suitable for high density plasma chemical vapor deposition (HDP-CVD) methods are also generally known the art of microelectronics fabrications. Therefore the method of the present invention is readily commercially implemented.

BRIEF DESCRIPTION OF THE DRAWING

The objects, features and advantages of the present invention are understood within the context of the Description of the Preferred Embodiments, as set forth below. The Description of the Preferred Embodiments is understood within the context of the accompanying drawings, which form a material part of this disclosure wherein.

DESCRIPTION OF THE PREFERRED EMBODIMENTS

The present invention provides a method for forming with enhanced interfacial adhesion a composite dielectric layer comprising a silicon containing dielectric layer upon a low dielectric constant dielectric layer upon a substrate layer within a microelectronics fabrication. The method of the present invention realizes this object by employing a plasma treatment of a low dielectric constant dielectric material layer prior to forming a silicon containing dielectric layer upon the underlying low dielectric constant dielectric layer which has been formed upon the microelectronics substrate layer.

The low dielectric constant dielectric layer may be formed employing an organic polymer low dielectric constant spin-on-polymer (SOP) dielectric material such as but not limited to polyimide organic polymer spin-on-polymer (SOP), poly (arylene ether) organic polymer spin-on-polymer(SOP) and fluorinated poly (arylene ether) organic polymer spin-on-polymer (SOP), low dielectric constant amorphous carbon and fluorinated amorphous carbon dielectric materials and low dielectric constant silsesquioxane (HSQ) spin-on-glass (SOG) dielectric materials. Alternatively, the low dielectric constant dielectric layer may be formed employing silicon containing materials such as but not limited to silicon oxide and silicon nitride wherein substrate and deposition conditions are selected so as to favor the formation of voids within the silicon containing material dielectric layer.

First Preferred Embodiment

Figure 1:
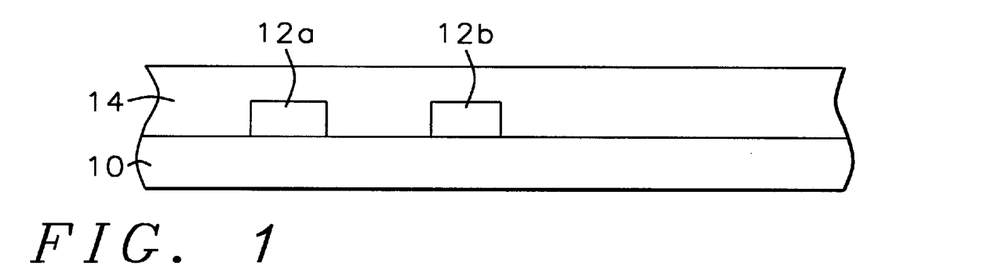
FIG. 1, FIG. 2 and FIG. 3 show a series of schematic cross-sectional diagrams illustrating the results of forming within a microelectronics fabrication in accord with a general embodiment of the present invention which comprises a first preferred embodiment of the present invention a composite dielectric layer with enhanced interfacial adhesion comprising at least a silicon containing dielectric layer upon a low dielectric constant dielectric layer
Figure 2:
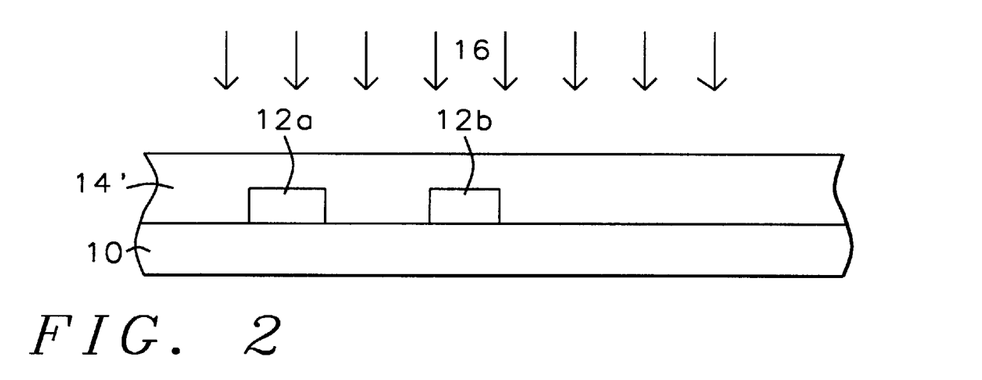
Figure 3:
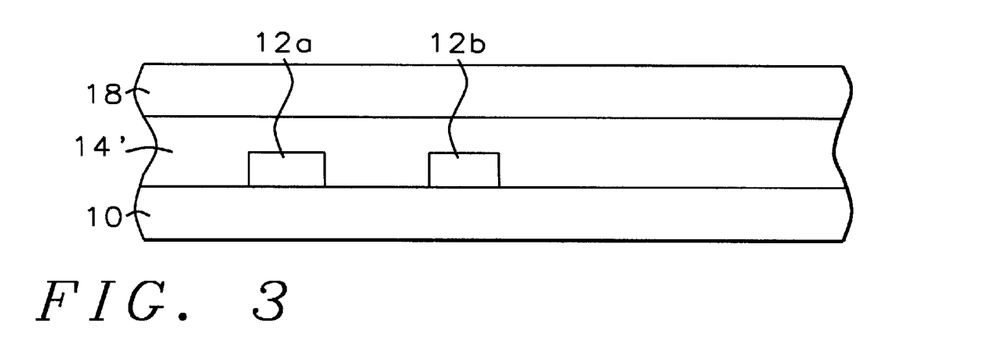

Referring now particularly to FIG. 1 to FIG. 3, there is shown a series of schematic cross-sectional diagrams illustrating the results of forming in accord with a general embodiment of the present invention which comprises a first preferred embodiment of the present invention a silicon containing dielectric layer with enhanced adhesion upon a low dielectric constant dielectric layer formed on a substrate layer of microelectronics fabrication. Shown in FIG. 1 is a schematic cross-sectional diagram of the microelectronics fabrication at an early stage in its fabrication in accord with the first preferred embodiment of the present invention.

Shown in FIG. 1 is a substrate 10 employed within a microelectronics fabrication. Formed on the substrate 10 is a pair of patterned layers 12a and 12b. Formed around and over the substrate 10 and the pair of patterned layers 12a and 12b is a low dielectric constant dielectric layer 14.

Within the first preferred embodiment of the present invention, the substrate 10 may be a substrate employed within a microelectronics fabrication selected from the group included but not limited to integrated circuit microelectronics fabrications, charge coupled device microelectronics fabrications, solar cell microelectronics fabrications, ceramic substrate microelectronics fabrications and flat panel display microelectronics fabrications. Although not specifically illustrated within the schematic cross-sectional diagram of FIG. 1, the substrate 10 may be the substrate itself employed within the microelectronics fabrication. Or in the alternative, the substrate 10 may be the substrate employed within the microelectronics fabrication, where the substrate has any of several additional microelectronics layers formed thereupon or thereover. Such additional microelectronics substrate layers (similarly with the substrate 10 itself) may include but are not limited to microelectronics conductor substrate layers, microelectronics semiconductor substrate layers and microelectronics dielectric substrate layers.

With respect to the pair of patterned microelectronics layers 12a and 12b, the patterned layers 12a and 12b may be formed from materials and employing methods as are conventionally employed within the art of microelectronics fabrication. Although not specifically illustrated within the schematic cross-sectional diagram of FIG. 1, the pair of patterned layers 12a and 12b may each have a thickness of from about 4000 to about 6000 angstroms, and a linewidth each from about 0.2 to about 1.0 microns.

With respect to the low dielectric constant dielectric layer 14, the low dielectric constant dielectric layer 14 may be formed employing organic polymer low dielectric constant spin-on-polymer (SOP) methods employing materials such as but not limited to polyimide organic polymers, poly (arylene ether) organic polymers and fluorinated poly (arylene ether) organic polymers, low dielectric constant spin-on-glass (SOG) dielectric materials including but not limited to silsesquioxane (HSQ) dielectric materials, and low dielectric constant amorphous carbon and fluorinated amorphous carbon dielectric materials formed by chemical vapor deposition (CVD). Alternatively, the low dielectric constant dielectric layer 14 may be formed employing silicon containing dielectric materials deposited by methods including but not limited to chemical vapor deposition (CVD), plasma enhanced chemical vapor deposition (PECVD) and physical vapor deposition (PVD) sputtering methods, wherein the deposition parameters are selected so as to produce within the silicon containing dielectric layer a series of voids to lower the dielectric constant of the silicon containing dielectric layer.

Referring now particularly to FIG. 2, there is shown a schematic cross-sectional diagram illustrating the results of further processing of the microelectronics fabrication whose schematic cross-sectional diagram is shown in FIG. 1. Shown in FIG. 2 is a schematic cross-sectional diagram of a microelectronics fabrication otherwise equivalent to FIG. 1, but wherein there is formed over the low dielectric constant dielectric layer 14 a plasma 16 which treats the low dielectric constant dielectric layer 14 to form a plasma treated low dielectric constant dielectric layer 14'. The plasma 16 is formed in a plasma reactor chamber conventionally employed in the art of microelectronics fabrication for plasma processing. The plasma may be formed from gases including but not limited to argon, nitrogen and nitrous oxide.

Preferably, the plasma is formed in argon gas employing the following process conditions: (1) top source power of from about 1100 to about 1500 watts; (2) side source power of from about 2500 to about 3500 watts; (3) bias power of from about 2500 to about 3500 watts; (4) substrate temperature of from about 360 to about 440 degrees centigrade; (5) argon gas flow rate of from about 100 to about 150 standard cubic centimeters per minute (sccm); (6) total pressure from about 1 to about 3 mTorr; and (7) radio frequency of 350 mHz.

Referring now particularly to FIG. 3, there is shown a schematic cross-sectional diagram illustrating the results of further processing of the microelectronics fabrication shown in FIG. 2. Shown in FIG. 3 is a schematic cross-sectional diagram of a microelectronics fabrication otherwise equivalent to the microelectronics fabrication shown in FIG. 2, but wherein there has been formed upon the plasma treated low dielectric constant dielectric layer 14' a silicon containing dielectric layer 18 with enhanced adhesion to the low dielectric constant dielectric layer 14. The silicon containing dielectric layer 18 may be formed from materials such as but not limited to silicon oxide and silicon nitride employing methods such as but not limited to chemical vapor deposition (CVD), plasma enhanced chemical vapor deposition (PECVD) and high density plasma chemical vapor deposition (HDP-CVD). Preferably, the silicon containing dielectric layer 18 is formed employing high density plasma chemical vapor deposition (HDP-CVD) method sequentially within the same reactor chamber wherein the exposure to the plasma 16 was done. The high density plasma chemical vapor deposition (HDP-CVD) method preferably employs: (1) a reactor chamber pressure of from about 1 to about 3 mTorr; (2) a substrate temperature of from about 350 to about 400 degrees centigrade; (3) a silane (SiH4) silicon source gas source flow rate of about 130 standard cubic centimeters per minute (sccm); (4) argon gas flow rate of about 130 standard cubic centimeters per minute (sccm); (5) oxygen gas flow rate of about 40 standard cubic centimeters per minute (sccm); (6) top source power of about 1300 watts; (7) side source power of about 3100 watts; and (8) bias power of about 3000 watts. Also preferably, the silicon containing dielectric layer 18 formed by high density plasma chemical vapor deposition (HDP-CVD) method is deposited within the same plasma reactor chamber employed for treatment of the low dielectric constant dielectric layer 14' by the plasma 16. Preferably, the high density plasma chemical vapor deposition (HDP-CVD) method employs silane (SiH4) as a silicon source gas, oxygen (O2) as an oxidizing gas and argon as a sputtering gas.

Alternatively, the silicon containing dielectric layer 18 may be formed from a fluorinated silicon containing glass (FSG) dielectric layer employing HDP-CVD in accord with the following process conditions: (1) reactor chamber pressure of about 1 to about 3 torr; (2) substrate temperature of about 400 degrees centigrade; (3) silane (SiH4) silicon source gas flow rate of from about 5 to about 40 standard cubic centimeters per minute (sccm); (4) silicon tetrafluoride (SiF4) fluorine source gas flow rate of about 30 standard cubic centimeters per minute; (5) oxygen gas flow rate of 104 standard cubic centimeters per minute (sccm); (6) top source power of about 800 watts; (7) side source power of about 3400 watts; (8) RF bias power of about 2900 watts; and (9) radio frequency of 350 mHz.

Second Preferred Embodiment

Figure 4:
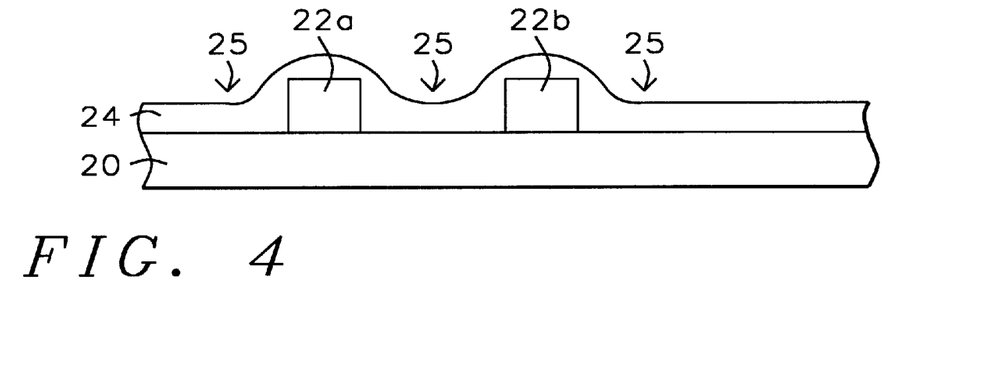
FIG. 4, FIG. 5 And FIG. 6 show a series of schematic cross-sectional diagrams illustrating the results of forming within a microelectronics fabrication in accord with a more specific embodiment of the present invention which comprises a second preferred embodiment of the present invention of the present invention a composite dielectric layer with enhanced interfacial adhesion comprising at least a silicon containing dielectric layer formed upon a low dielectric constant dielectric layer.
Figure 5:
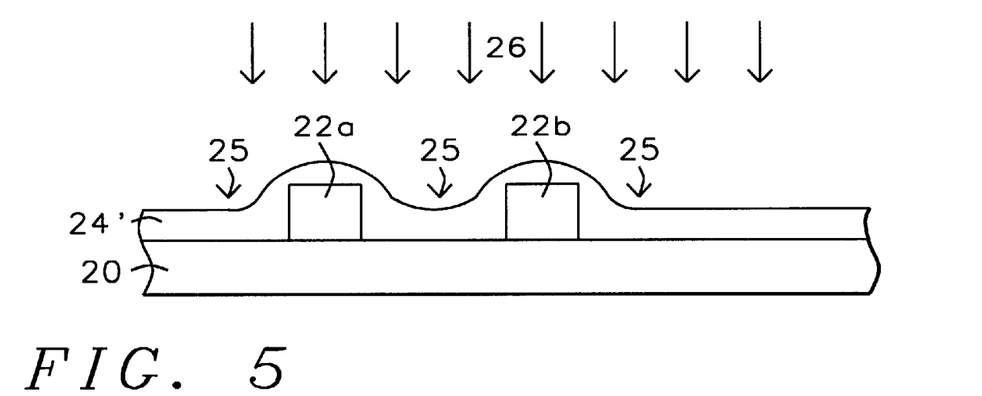
Figure 6:
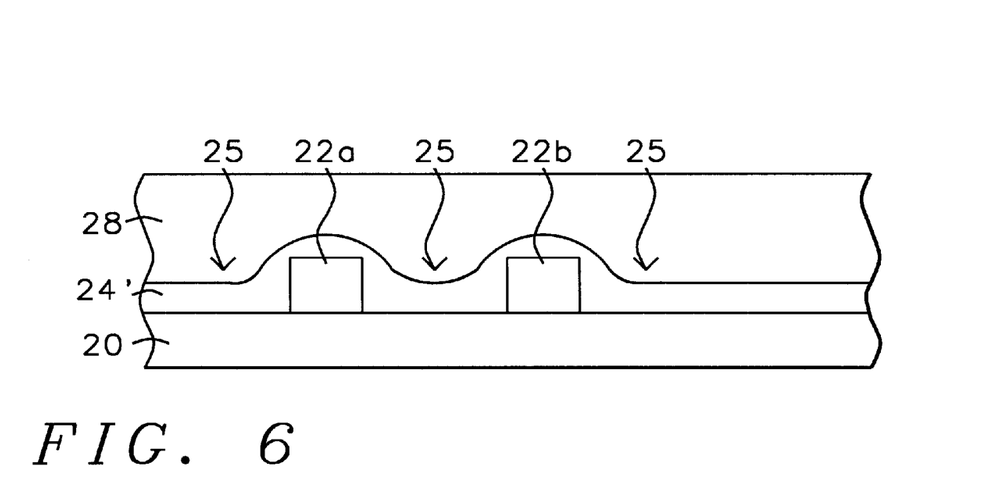

Referring now to FIG. 4 to FIG. 6, there is shown a series of schematic cross-sectional diagrams illustrating the results of forming within a microelectronics fabrication in accord with a more specific embodiment of the present invention which comprises a second preferred embodiment of the present invention a silicon containing dielectric cap layer with enhanced adhesion upon a low dielectric constant dielectric layer formed upon a microelectronics substrate layer.

Shown in FIG. 4 is a schematic cross-sectional diagram of a microelectronics fabrication at an early stage in its fabrication in accord with the second preferred embodiment of the present invention. Shown in FIG. 4 is a substrate 20 having formed thereon a series of patterned microelectronics layers 22a and 22b. A low dielectric constant dielectric layer 24 is formed upon and around the substrate 20 and the series of patterned layers 22a and 22b.

With respect to the substrate 20, the substrate 20 may be a microelectronics substrate analogous or equivalent to the substrate 10 shown in FIG. 1 employed within the first preferred embodiment of the present invention.

With respect to the pair of patterned microelectronics layers 22a and 22b shown in FIG. 4, the pair of patterned microelectronics layers 22a and 22b is analogous or equivalent to the pair of patterned microelectronics layers 12a and 12b employed within the first preferred embodiment of the present invention shown in FIG. 1.

With respect to the low dielectric constant dielectric layer 24 shown in FIG. 4, the low dielectric constant dielectric layer 24 is analogous or equivalent to the low dielectric constant dielectric layer 14 employed within the first preferred embodiment of the present invention shown in FIG. 1, except that the top surface of the low dielectric constant dielectric layer 24 does not rise above the top level of the patterned microelectronics layer 22a and 22b, forming a series of depressions 25 within the low dielectric constant dielectric layer 24 within the microelectronics fabrication whose schematic cross-sectional diagram is shown in FIG. 4.

Referring now particularly to FIG. 5, there is shown a schematic cross-sectional diagram illustrating the results of further processing of the microelectronics fabrication whose schematic cross-sectional diagram is shown in FIG. 4. Shown in FIG. 5 is a schematic cross-sectional diagram of a microelectronics fabrication otherwise identical to the microelectronics fabrication shown in FIG. 4, but wherein there is formed a plasma 26 within a plasma reactor chamber. The plasma 26 is analogous or equivalent to the plasma 16 employed within the first preferred embodiment of the present invention shown in FIG. 2 to which the low dielectric constant dielectric layer 24 is treated to form the plasma treated low dielectric constant dielectric layer 24' analogous or equivalent to the plasma treated low dielectric constant dielectric layer 14' of FIG. 1.

With respect to the plasma 26, the plasma 26 may be formed from a gas equivalent to or analogous to the plasma 16 of FIG. 2. Preferably, the plasma 26 is formed from nitrous oxide (N₂O) gas in a plasma reactor employing the following process conditions: (1) gas pressure of about 1 to about 3 torr; (2) gas flow rate of about 125 standard cubic centimeters per minute (sccm); (3) power of about 3000 watts; (4) temperature of about 400 degrees centigrade; and (5) radio frequency of 350 mHz.

Referring now particularly to FIG. 6, there is shown a schematic cross-sectional diagram illustrating the results of further processing of the microelectronics fabrication whose schematic cross-sectional diagram is shown in FIG. 5. Shown in FIG. 6 is a schematic cross-sectional diagram of a microelectronics fabrication otherwise identical with FIG. 5, but wherein there is formed a silicon containing dielectric layer 28 with enhanced adhesion and gap filling over the plasma treated low dielectric constant dielectric layer 24' and the series of depressions 25.

With respect to the silicon containing dielectric layer 28, the silicon containing dielectric layer 28 is equivalent or analogous to the silicon containing dielectric layer 18 shown in nitride employing high density plasma chemical vapor deposition (HDP-CVD)) methods as are known in the art of microelectronics fabrication.

Figure 7:
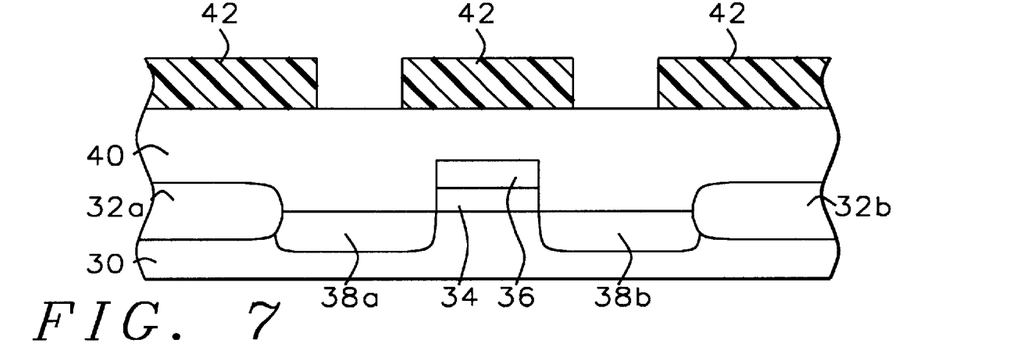
FIG. 7, FIG. 8, FIG. 9, FIG. 10, FIG. 11 and FIG. 12 show a series of schematic cross-sectional diagrams illustrating the results of forming within an integrated circuit microelectronics fabrication in accord with a more specific embodiment of the present invention which comprises a third preferred embodiment of the present invention a composite dielectric layer with enhanced interfacial adhesion comprising at least a silicon containing dielectric cap layer upon a thin low dielectric constant dielectric layer formed employing an organic polymer low dielectric constant spin-on-polymer (SOP).

As an optional step illustrated in FIG. 6, the silicon containing dielectric layer 28 may be planarized to form a planar surface 29 by a process known in the art of microelectronics Third Preferred Embodiment Referring now to FIG. 7 to FIG. 12, there is shown a series of schematic cross-sectional diagrams illustrating the results of forming upon a substrate employed within a embodiment of the present invention which comprises a third preferred embodiment of the present invention a silicon containing dielectric layer with enhanced adhesion upon a low dielectric constant dielectric layer formed upon the substrate. Shown in FIG. 7 is a semiconductor substrate 30 having formed within and upon its surface a pair of isolation regions 32a and 32b which defines an active region of the semiconductor substrate 30. Although semiconductor substrates are known in the art of semiconductor integrated circuit fabrication with either dopant polarity, several dopant concentrations and various crystallographic orientations, for the third preferred embodiment of the present invention, them semiconductor substrate 30 is preferably a (100) silicon semiconductor substrate having an N- or P-type doping.

Similarly, although it is known in the art of semiconductor integrated circuit microelectronics fabrication that isolation regions may be formed within and upon semiconductor substrates while employing methods including but not limited to isolation region thermal growth methods and isolation region deposition/patterning methods, for the third preferred embodiment of the present invention the isolation regions 32a and 32b are preferably formed within and upon the semiconductor substrate 30 while employing an isolation thermal growth method at a temperature of from about 800 to about 1000 degrees centigrade to form within and upon the semiconductor substrate 30 the pair of isolation regions 32a and 32b.

Shown also within FIG. 7 formed within and upon the active region of the semiconductor substrate 30 is a field effect transistor (FET) which comprises a series of structures including: (1) a gate dielectric layer 34 formed upon the active region of the semiconductor substrate 30, the gate dielectric layer 34 having been formed and aligned thereupon; (2) a gate electrode 36; and (3) a pair of source/drain regions 38a and 38b formed within the active region of the semiconductor 30 at areas not covered by the gate dielectric layer 34 and the gate electrode 36. Each of the structures within the series of structures which comprises the field effect transistor (FET) may be formed employing methods and materials which are conventional in the art of field effect transistor (FET) fabrication.

For example, although it is known in the art of field effect transistor (FET) fabrication that gate dielectric layers may be formed through patterning, employing methods as are conventional in the art, of blanket gate dielectric layers formed upon active regions of semiconductor substrates employing methods including but not limited to blanket gate dielectric layer thermal growth methods and blanket gate dielectric layer deposition/patterning methods, for the third preferred embodiment of the present invention the blanket gate dielectric layer 34 is preferably formed through patterning, employing methods as are conventional in the art of a blanket gate dielectric layer formed employing a blanket gate dielectric layer thermal growth method art a temperature of from about 700 to about 900 degrees centigrade to form the blanket gate dielectric layer 34 of silicon oxide of thickness from about 30 to about 50 angstroms upon the active region of the semiconductor substrate 30.

Similarly, although it is know in the art of field effect transistor (FET) fabrication that gate electrodes may be formed through patterning, employing methods as are conventional in the art, of blanket gate electrode material layers formed of gate electrode materials including but not limited to metals, metal alloys, doped polysilicon or polycides (doped polysilicon/metal silicide stacks), for the third preferred embodiment of the present invention the gate electrode 36 is preferably formed through patterning, employing methods as are conventional in the art, of a blanket layer of a doped polysilicon or a polycide gate electrode material formed upon the blanket gate dielectric layer to a thickness of from about 1600 to about 2200 angstroms.

Finally, it is known in the art of field effect transistor (FET) fabrication that source/drain regions are typically formed into active regions of a semiconductor substrate employing ion implantation methods which employ dopant ions of polarity opposite the polarity of the semiconductor substrate within which is formed those source/drain regions. For the third preferred embodiment of the present invention, the source/drain regions 38a and 38b are preferably formed within the active region of the semiconductor substrate 30 employing a high dose implant at an ion implant dose of from about $1 \times 10^{15}$ to about $5 \times 10^{15}$ dopant ions per square centimeter and at an ion implantation energy of from about 5 to about 60 keV while employing at least the gate electrode 36 and the gate dielectric layer 34 as an $N^+$ ion implantation mask.

There is also shown in FIG. 7 formed over the semiconductor substrate 30 and the series of structures which forms the field effect transistor (FET) a boron-phosphorus (B-P) doped silicon containing glass (BPSG) dielectric layer 40. The boron-phosphorus doped silicon containing glass dielectric layer 40 is formed employing materials and methods analogous to the materials and methods employed for the silicon containing glass dielectric layer 18 as shown in FIG. 3 of the first preferred embodiment of the present invention. Preferably, the boron-phosphorus doped silicon containing glass dielectric layer 40 is formed by the method of ozone assisted sub-atmospheric pressure thermal chemical vapor deposition (SACVD) employing the following process conditions: (1) tetra-ethyl-ortho-silicate (TEOS) silicon source gas flow rate of about 2000 standard cubic centimeters per minute (sccm); (2) helium carrier gas flow rate of about 4000 standard cubic centimeters per minute (sccm); (3) total pressure of about 500 torr; (4) trimethylboron (TMB) source gas concentration of about 4.0 milligrams/cubic meter ($mg/m^3$) (5) trimethylphosphine (TMP) source gas concentration of about 3.0 milligrams/cubic meter ($mg/m^3$); (6) temperature of about 400 degrees centigrade. Formed upon the boron-phosphorus doped silicon containing glass dielectric layer 40 is a photoresist mask layer 42 formed into a pattern of contact via holes to be replicated by etching through the doped silicon containing glass dielectric layer 40 by conventional photolithographic methods as are known in the art of integrated circuit microelectronics fabrication.

Figure 8:
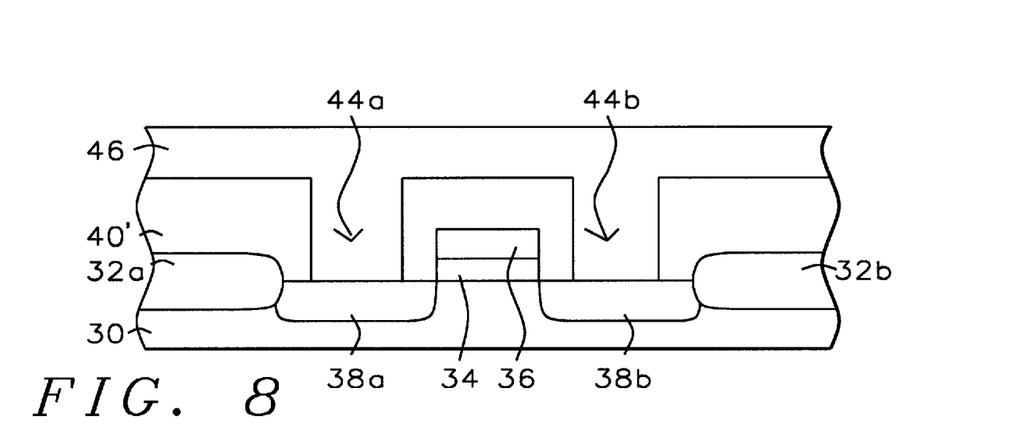

Referring now particularly to FIG. 8, there is shown a schematic cross-sectional diagram of an integrated circuit microelectronics fabrication illustrating the results of further processing of the integrated circuit microelectronics fabrication whose schematic cross-sectional diagram is shown in FIG. 7. Shown in FIG. 8 is a schematic cross-sectional diagram of an integrated circuit microelectronics fabrication otherwise identical to the integrated circuit microelectronics fabrication shown in FIG. 7, but wherein there has been etched the via contact holes 44a and 44b through the doped silicon containing glass dielectric layer 40'. After removing the photoresist mask pattern 42, a low dielectric constant dielectric layer 46 has been formed over and around the etched doped silicon containing glass dielectric layer 40'.

With respect to the low dielectric constant dielectric layer 46, the low dielectric constant dielectric layer 46 is formed employing materials and methods equivalent or analogous to the materials and methods employed to form the low dielectric constant dielectric layer 14 shown in FIG. 1 of the first preferred embodiment of the present invention and the low dielectric constant dielectric layer 24 shown in FIG. 4 of the second preferred embodiment of the present invention. Preferably, the low dielectric layer 46 is formed employing low dielectric constant spin-on-polymer (SOP) or spin-on-glass (SOG) dielectric materials and methods as are known in the art of microelectronics fabrication.

Figure 9:
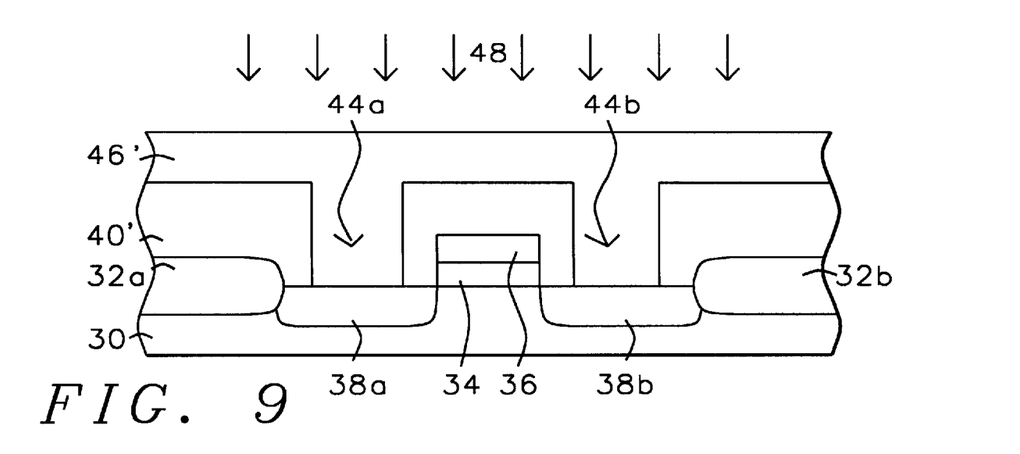

Referring now to FIG. 9, there is shown a schematic cross-sectional diagram of an integrated circuit microelectronics fabrication illustrating the results of further processing of the integrated circuit microelectronics fabrication whose schematic cross-sectional diagram is shown in FIG. 8. Shown in FIG. 9 is a schematic cross-sectional diagram of an integrated circuit microelectronics fabrication otherwise identical to the integrated circuit microelectronics fabrication shown in FIG. 8, but wherein there has been treated the low dielectric constant dielectric layer 46 with a plasma 48 to form the plasma treated low dielectric constant dielectric layer 46'. The plasma 48 is equivalent or analogous to the plasma 16 shown in FIG. 2 of the first preferred embodiment of the present invention and the plasma 26 shown in FIG. 4 of the second preferred embodiment of the present invention.

Figure 10:
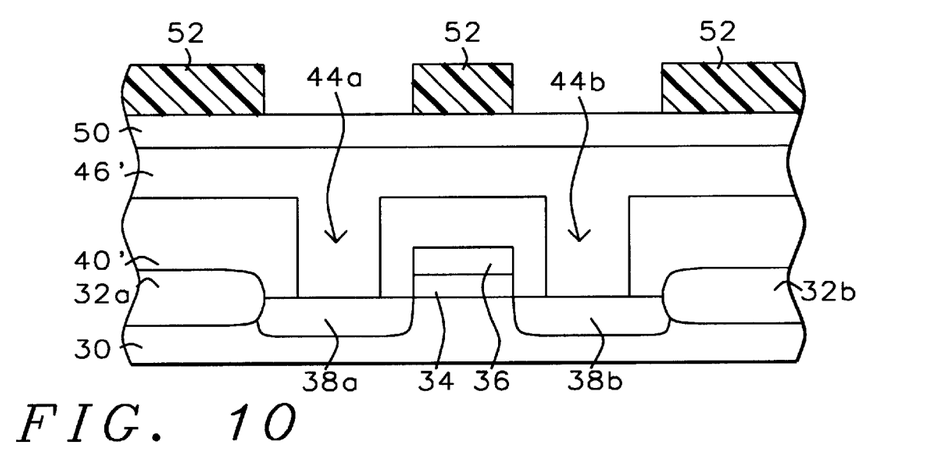

Referring now to FIG. 10, there is shown a schematic cross-sectional diagram of an integrated circuit microelectronics fabrication illustrating the results of further processing of the integrated circuit microelectronics fabrication whose schematic cross-sectional diagram is shown in FIG. 9. Shown in FIG. 10 is an integrated circuit microelectronics fabrication otherwise equivalent to the integrated circuit microelectronics fabrication whose schematic cross-sectional diagram is shown in FIG. 9, but wherein there has been formed upon the plasma treated low dielectric constant dielectric layer 46' a silicon containing dielectric layer 50 with enhanced adhesion to the underlying plasma treated low dielectric constant dielectric layer 46'. The silicon containing dielectric layer 50 is formed employing materials and methods equivalent or analogous to the silicon containing dielectric layer 18 shown in FIG. 3 of the first preferred embodiment of the present invention and the silicon containing dielectric layer 28 shown in FIG. 6 of the second preferred embodiment of the present invention. The silicon containing dielectric layer 50 is to serve as a hard mask for subsequent processing. Shown also in FIG. 10 is a photoresist mask layer 52 formed in the pattern of a microelectronics conductor layer for which a corresponding trench is to be etched by pattern transfer to the underlying silicon containing dielectric layer 50 by conventional photolithographic methods and materials as are known in the art of integrated circuit microelectronics fabrication.

Figure 11:
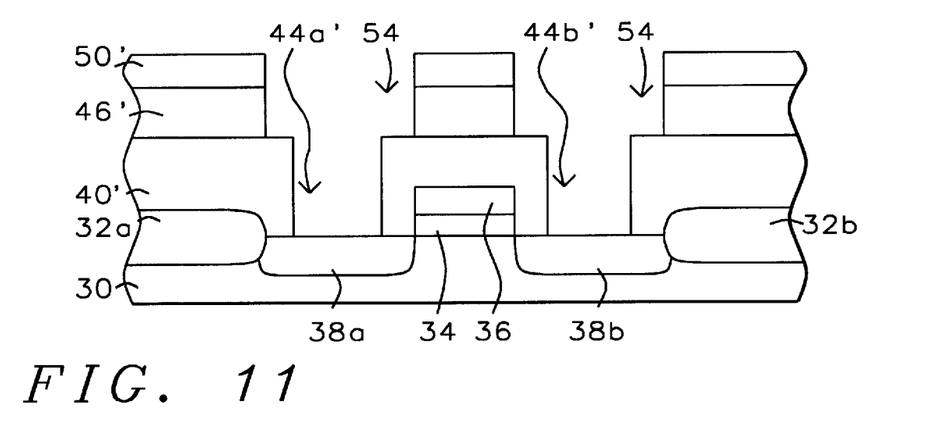

Referring now to FIG. 11, there is shown a schematic cross-sectional diagram of an integrated circuit microelectronics fabrication illustrating the results of further processing of the integrated circuit microelectronics fabrication shown in FIG. 10. Shown in FIG. 11 is an integrated circuit microelectronics fabrication otherwise identical to the integrated circuit microelectronics fabrication whose schematic cross-sectional diagram is shown in FIG. 10, but wherein there has been etched a trench 54 corresponding to the photoresist mask layer 52 after which the photoresist mask layer has been removed. Also shown in FIG. 11 are the contact via holes 44a' and 44b' re-etched in the silicon oxide layer by plasma etching techniques employing the silicon nitride hard mask layer to mask the etching of the contact via hole pattern by conventional plasma etching methods and materials as are known in the art of integrated circuit microelectronics fabrication.

Figure 12:
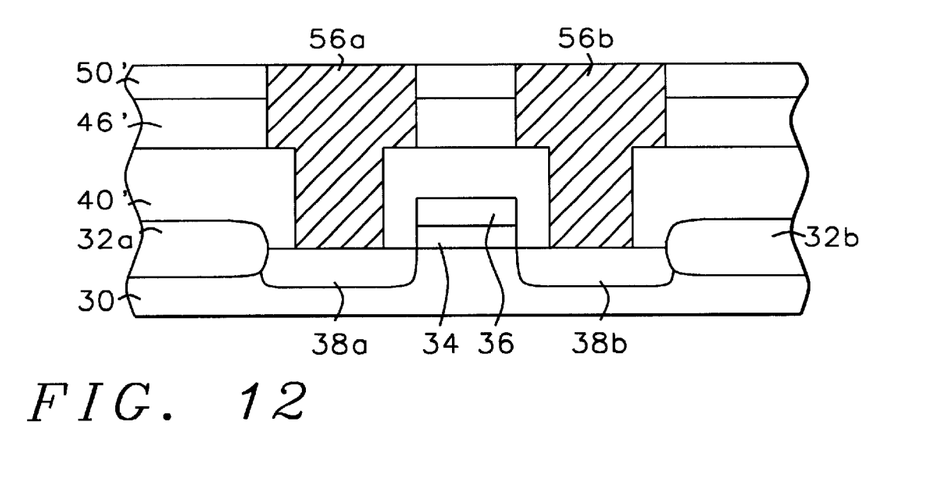

Referring now to FIG, 12, there is shown a schematic cross-sectional diagram of an integrated circuit microelectronics fabrication illustrating the results of further processing of the integrated circuit microelectronics fabrication whose schematic cross-sectional diagram is shown in FIG. 11. Shown in FIG. 12 is an integrated circuit microelectronics fabrication otherwise identical to the integrated circuit microelectronics fabrication whose schematic cross-sectional diagram is shown in FIG. 11, but wherein there has been formed in the trench conductor pattern 54 and the contact via hole pattern a recessed conductive layer 56a and 56b whose top surface is essentially co-planar with the top of the silicon nitride dielectric layer 50 which served as the patterned hard mask for transfer of the conductor trench pattern 52a and 52b and the via hole contact pattern 42a and 42b.

Figure 13:
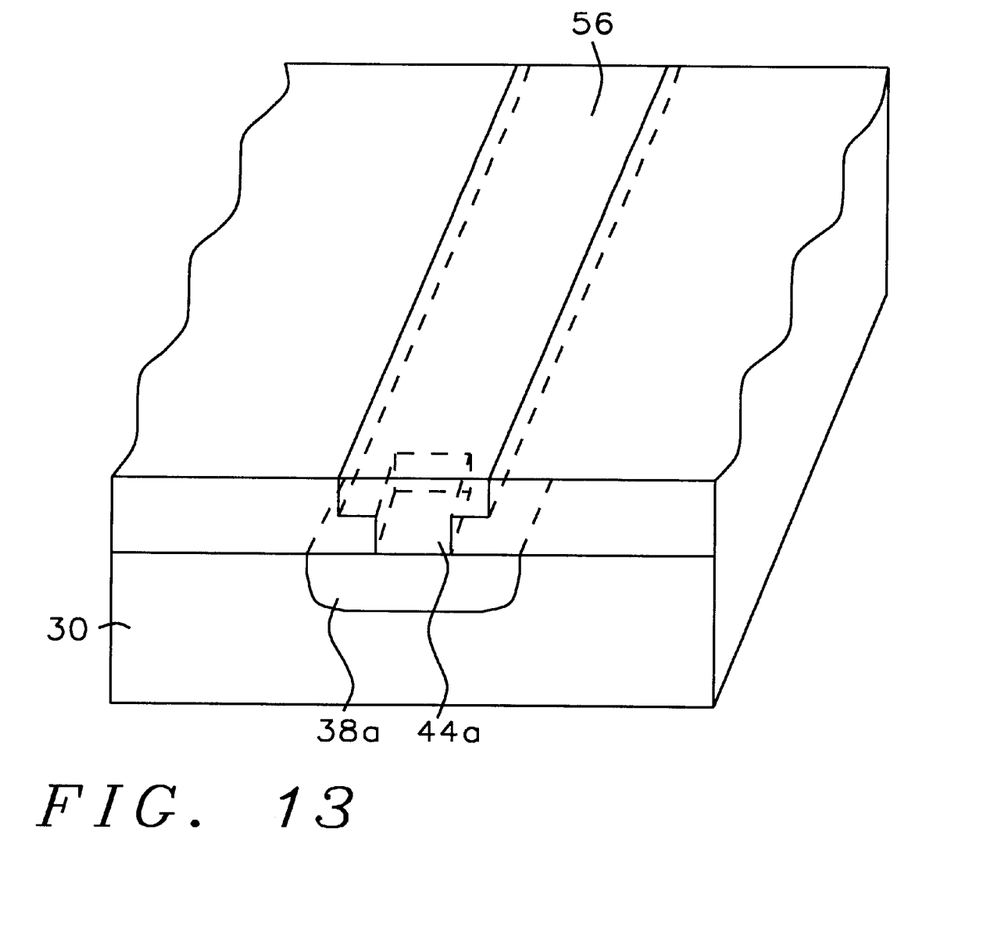
FIG. 13 is an isometric plan view of a dual damascene structure made in accordance with the third embodiment of the present invention.

The conductor interconnection layer and the contact via hole conductor materials 56a and 56b together form an interconnection structure which is sometimes referred to as a "dual damascene" structure: i.e., an inlay structure of recessed conductor patterns forming both the via contacts to the underlying circuits and the interconnections to the contacts and other circuits of the integrated circuit microelectronics fabrication. The overall dual damascene structure is shown in plan view in the schematic diagram of FIG. 13

With respect to the interconnection and via contact hole conductor materials of the patterned conductor layer 56a and 56b, the conductor layer 56a and 56b may be formed from materials including but not limited to metals such as aluminum, copper, gold, molybdenum platinum and their alloys, conductive compounds such as titanium nitride, tungsten suicide and hafnium nitride, and semiconductors such as doped polycrystalline and amorphous silicon formed employing methods including but not limited to thermal evaporation, electron beam evaporation, chemical vapor deposition (CVD), physical vapor deposition (PVD) sputtering methods and electrochemical plating methods. Preferably, the patterned conductor layer 56a and 56b is formed employing copper conductor layers and tantalum nitride (TaN) barrier layers formed by electrochemical plating methods as are known in the art of microelectronics fabrication.

With respect to the preferred embodiments of the present invention, alternatively, low dielectric constant dielectric layers may be formed from silicon containing dielectric materials when formed into layers by certain methods so as to contain internal vacuum or gas-filled voids which serve to reduce the average dielectric constant of the silicon containing dielectric layer to a range of values lower than that typical or silicon containing dielectric material as stated above. Silicon containing materials such as but not limited to silicon oxide and silicon nitride may be deposited by methods including but not limited to chemical vapor deposition (CVD) methods, physical vapor deposition (PVD) sputtering methods and vacuum evaporation methods in which substrate surface conditions and process dielectric layer parameters may be selected so as to form vacuum or gas-filled voids within the deposited silicon containing dielectric layer.

Microelectronics fabrication methods often employ photolithographic methods within which photosensitive organic polymer photoresist layers are employed to form the mask pattern which is transferred to underlying layers by etching methods. Such photoresist layers and etching methods are precluded for organic polymer low dielectric constant dielectric layers because the organic polymer layers interact chemically and also the photosensitive organic polymer mask pattern cannot be removed after etching without also disturbing the underlying etched patterned organic polymer low dielectric constant. Thus the formation of patterned organic polymer low dielectric constant dielectric layers requires the use of overlying patterned stencil mask layers known as hard mask layers to allow etching and patterning of the organic polymer low dielectric constant dielectric layer. Typically such overlying patterned hard mask layers are formed of durable silicon containing materials including but not limited to silicon oxide and silicon nitride. However, the differences in the material properties of the organic polymer low dielectric constant dielectric layers and the overlying silicon containing hard mask layers may cause problems such as differential stresses between the layers. Also, the inherent difference in the chemical nature of the organic polymer spin-on-polymer (SOP) dielectric layer and the overlying silicon containing hard mask layer may not permit adequate adhesive bonding at the interface between the two different layers to prevent delamination. Thus enhancement of the interlayer adhesion in such composite dielectric layer structures is of great benefit.

Additionally in microelectronics fabrications, it is common to form over patterned conductor and dielectric layers an additional dielectric cap layer to serve as the substrate layer for additional conductor and/or low dielectric constant layers. Typically, this second dielectric cap layer is formed by methods such as but not limited to plasma enhanced chemical vapor deposition (PECVD), sub-atmospheric thermal chemical vapor deposition (SACVD) and physical vapor deposition (PVD) sputtering from materials such as but not limited to silicon oxide and silicon nitride. In microelectronics fabrications there is frequent occasion to planarize the top surface of this deposited dielectric layer over patterned conductor and/or dielectric layers for subsequent processing. Typically, planarized top surfaces are formed employing chemical mechanical polish (CMP) planarization methods, which necessitates that the adhesion of the dielectric layer to underlying layers be sufficient to permit chemical mechanical polish (CMP) methods to be employed, and requires an etch stop layer to prevent overpolishing.

Another advantage of the present invention is providing a method in which the enhancement of the adhesion of an upper silicon containing dielectric layer and the subsequent deposition of said upper silicon containing dielectric layer upon a low dielectric constant dielectric layer take place in the same chamber, wherein the plasma treatment of the underlying low dielectric constant dielectric layer is followed by formation of the silicon containing dielectric layer by the method of chemical vapor deposition (CVD).

As is understood by a person skilled in the art, the preferred embodiments of the present invention are illustrative of the present invention rather than limiting of the present invention. Revisions and modifications may be made to methods, materials, structures and dimensions through which are formed microelectronics fabrications in accord with the first and second preferred embodiments of the present invention and semiconductor integrated circuit microelectronics fabrications in accord with the third preferred embodiment of the present invention.

What is claimed is:

1. A method for forming within an integrated circuit microelectronics fabrication a dielectric layer comprising:

providing a semiconductor substrate;

forming within and upon the semiconductor substrate an integrated circuit microelectronics fabrication;

forming over the integrated circuit microelectronics fabrication a silicon oxide dielectric layer;

forming within the silicon oxide dielectric layer a contact via hole pattern to the underlying integrated circuit microelectronics fabrication;

forming over the patterned silicon oxide dielectric layer a low dielectric constant dielectric layer having a dielectric constant of from about 2.5 to 3.3;

treating the low dielectric constant dielectric layer with a plasma formed in nitrous oxide ($N_2O$) gas to form a plasma treated low dielectric constant dielectric layer having a dielectric constant of from about 2.5 to 3.3;

forming a silicon containing dielectric mask layer over the plasma treated low dielectric constant dielectric layer;

forming upon the silicon containing dielectric mask layer a patterned photoresist etch mask layer of a trench pattern to interconnect the via hole pattern;

etching the trench pattern into and through the silicon containing dielectric mask layer and underlying low dielectric constant dielectric layer to form a conductor pattern interconnecting the previously formed contact via hole pattern;

further etching the contact via hole pattern through the low dielectric constant dielectric layer to the underlying integrated circuit microelectronics fabrication formed within the semiconductor substrate;

stripping the photoresist etch mask layer; and forming an inlay pattern of conductor material within the via hole contact pattern and the trench interconnection pattern to form a dual damascene interconnection pattern.

2. The method of claim 1 wherein the plasma treatment of the low dielectric constant dielectric layer enhances adhesion of the silicon containing dielectric mask layer to the plasma treated low dielectric constant dielectric layer.

3. The method of claim 1 wherein the substrate is a silicon semiconductor substrate.

4. The method of claim 1 wherein the low dielectric constant dielectric layer is selected from the group consisting of:

organic polymer low dielectric constant spin-on-polymer (SOP) dielectric materials each having a dielectric constant of from about 2.5 to 3.3;

amorphous carbon and fluorinated amorphous carbon dielectric materials; and silsesquioxane spin-on-glass (SOP) dielectric materials.

5. The method of claim 1 wherein the conductive material inlaid into the via contact hole pattern and the trench interconnection conductor pattern is selected from the group consisting of:

aluminum;

copper; and tantalum nitride.

* * * * *